(12) United States Patent
Ku et al.

(10) Patent No.: US 12,501,538 B2
(45) Date of Patent: Dec. 16, 2025

(54) THERMAL SOLUTIONS FOR COOLING ELECTRONIC DEVICES

(71) Applicant: Intel Corporation, Santa Clara, CA (US)

(72) Inventors: Jeff Ku, Taipei (TW); Baomin Liu, Hillsboro, OR (US); Cora Nien, Taipei (TW); Min Suet Lim, Gelugor (MY); Tongyan Zhai, Portland, OR (US)

(73) Assignee: Intel Corporation, Santa Clara, CA (US)

(*) Notice: Subject to any disclaimer, the term of this patent is extended or adjusted under 35 U.S.C. 154(b) by 344 days.

(21) Appl. No.: 18/121,297

(22) Filed: Mar. 14, 2023

(65) Prior Publication Data

US 2024/0314921 A1    Sep. 19, 2024

(51) Int. Cl.
| | |
|---|---|
| *H05K 1/02* | (2006.01) |
| *F16K 31/50* | (2006.01) |
| *H05K 7/20* | (2006.01) |

(52) U.S. Cl.
CPC ......... *H05K 1/0209* (2013.01); *F16K 31/504* (2013.01); *H05K 7/20254* (2013.01); *H05K 2201/0209* (2013.01)

(58) Field of Classification Search
CPC ........... H05K 7/20136; H05K 7/20154; H05K 7/20254; H05K 7/20272; H05K 7/20309; H05K 7/20318; H05K 7/20327; H05K 7/20336; H05K 7/20381; H05K 7/2039; H05K 7/20518; H05K 7/20963; H05K 7/2099; H05K 1/0203; H05K 1/0209–0212; H05K 1/14; H05K 2201/10545; H05K 2201/066; H01L 23/34; H01L 23/367; H01L 23/473; H01L 21/4884; H01L 25/0657; G06F 1/20;
(Continued)

(56) References Cited

U.S. PATENT DOCUMENTS

| | | | |
|---|---|---|---|
| 10,925,190 B2* | 2/2021 | Gao | H05K 7/20254 |
| 11,683,913 B2* | 6/2023 | Zhang | G06F 1/20 |
| | | | 361/679.53 |

(Continued)

FOREIGN PATENT DOCUMENTS

| | | |
|---|---|---|
| GB | 2576032 | 4/2021 |
| GB | 2576030 | 12/2021 |

(Continued)

OTHER PUBLICATIONS

Owen, "Adding water cooling to the Mac Studio does surprisingly little," Sep. 20, 2022, retrieved from https://appleinsider.com/articles/22/09/20/adding-water-cooling-to-the-mac-studio-does-surprisingly-little, 13 pages.

(Continued)

*Primary Examiner* — Amir A Jalali
(74) *Attorney, Agent, or Firm* — Hanley, Flight & Zimmerman, LLC

(57) ABSTRACT

Methods, apparatus, systems, and articles of manufacture are disclosed to cool electronic devices. An example thermal solution to cool an electronic device Includes a first cooling plate at a first side of a printed circuit board and a second cooling plate at a second side of the printed circuit board, the second side opposite the first side. The second cooling plate is fluidically coupled with the first cooling plate.

16 Claims, 8 Drawing Sheets

(58) Field of Classification Search
CPC .............. G06F 1/203; G06F 2200/201; F28D 15/0233; F28D 15/0275; F28D 15/04; F28F 13/182

See application file for complete search history.

(56) References Cited

U.S. PATENT DOCUMENTS

| | | | | |
|---|---|---|---|---|
| 12,055,986 | B2* | 8/2024 | Macias | H05K 7/20772 |
| 2003/0085024 | A1* | 5/2003 | Santiago | B01D 61/427 |
| | | | | 257/E23.098 |
| 2010/0038058 | A1* | 2/2010 | Gunturi | H01L 23/473 |
| | | | | 165/80.4 |
| 2010/0315782 | A1* | 12/2010 | Pautsch | F28F 3/12 |
| | | | | 361/702 |
| 2012/0103576 | A1* | 5/2012 | Toftloekke | G06F 1/203 |
| | | | | 165/104.33 |
| 2016/0183407 | A1* | 6/2016 | Katsumata | H05K 1/181 |
| | | | | 361/699 |
| 2016/0270259 | A1* | 9/2016 | Chainer | H05K 7/20272 |
| 2020/0337181 | A1* | 10/2020 | Tian | H01L 23/473 |
| 2021/0092878 | A1* | 3/2021 | Gao | H05K 7/20254 |
| 2021/0320050 | A1 | 10/2021 | Robinson et al. | |
| 2022/0095484 | A1* | 3/2022 | Loo | G06F 1/20 |
| 2022/0304193 | A1* | 9/2022 | Shearman | H05K 7/2039 |
| 2023/0108843 | A1* | 4/2023 | Rahman | H01L 25/0657 |
| | | | | 361/699 |
| 2023/0269909 | A1* | 8/2023 | Grillanda | H01S 5/02438 |
| | | | | 372/35 |

FOREIGN PATENT DOCUMENTS

| | | |
|---|---|---|
| GB | 2597525 | 2/2022 |
| GB | 2601357 | 6/2022 |

OTHER PUBLICATIONS

Apple, "A true powerhouse," https://www.apple.com/mac-studio/?afid=p238%7Cs9801KOKA-dc_mtid_20925top39173_pcrid_662348054119_pgrid_132913997023_pexid_&cid=wwa-us-kwgo-mac-slid---Brand-MacStudio-Avail-, retrieved on Jun. 13, 2023, 23 pages.

XMG Oasis The first portable laptop watercooling, retrieved from https://www.xmg.gg/en/xmg-oasis/, retrieved on Jun. 13, 2023, 12 pages.

Techpowerup, XMC, retrieved from https://www.techpowerup.com/review/xmg-neo-15-e22-laptop-i7-12700h-rtx-3080-i-oasis-external-liquid-cooling-system/, on Jun. 13, 2023, 4 pages.

Mighty Mini Fan & Blower, retrieved from https://www.sunon.com/eu/PRODUCT.ASPX?cid=E5D3D69AC8994656&oid=257C606B0CFA5D12&utm_source=googlemmf&gad=1&gclid=EAlalQobChMI6I-5-ODA_wIV1-3ICh102Qo7EAMYASAAEgJAdPD_BwE, on Jun. 13, 2023, 4 pages.

* cited by examiner

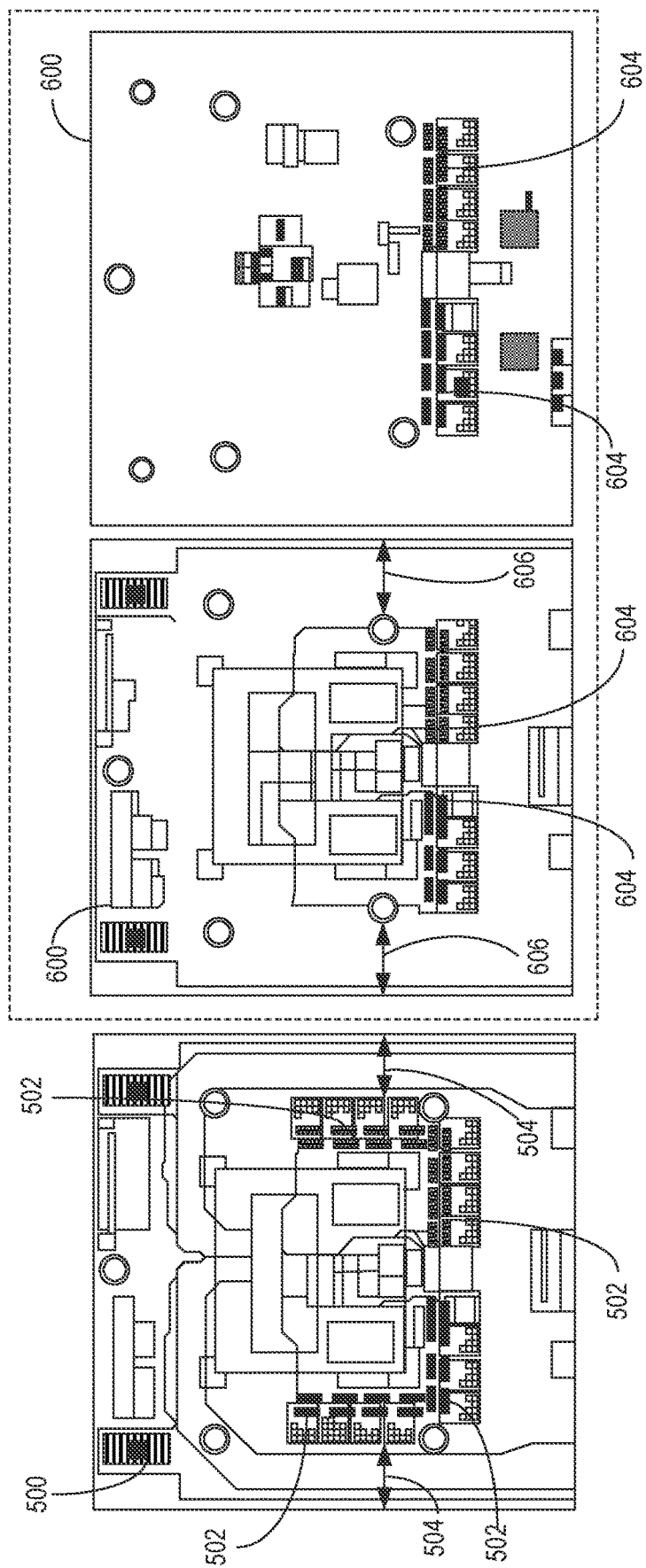

THERMAL SOLUTIONS FOR COOLING ELECTRONIC DEVICES

FIELD OF THE DISCLOSURE

This disclosure relates generally to electronic devices and, more particularly, to thermal solutions for cooling electronic devices.

BACKGROUND

Electronic devices generate heat. Thermal solutions are used to dissipate the heat generated by electronic devices to cool the electronic devices and prevent overheating.

BRIEF DESCRIPTION OF THE DRAWINGS

FIG. 5 is a known printed circuit board layout.

FIG. 6 is an example printed circuit board layout of a first side of an example printed circuit board including an example thermal solution disclosed herein.

FIG. 7 is an example printed circuit board layout of a second side of the printed circuit board of FIG. 6.

Figure 1:
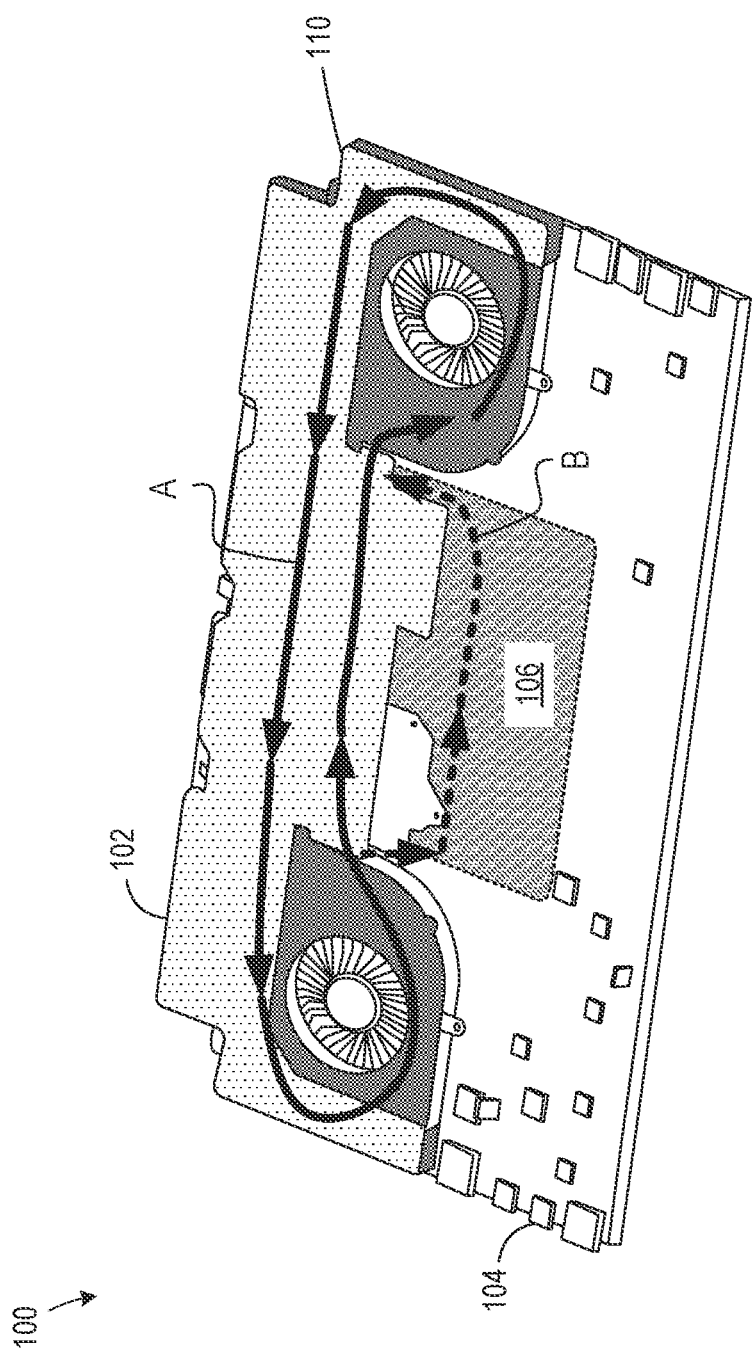
FIG. 1 is a schematic perspective view of a portion of an example electronic device including an example thermal solution with two example cooling plates.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

DETAILED DESCRIPTION

Electronic devices can include one or more central processing units (CPUs) and/or one or more graphical processing units (GPUs) and/or one or more other heat generating components. As the power of CPUs and GPUs increase, more heat is generated, which can lead to hot spots on the chassis or skin of the electronic devices. Heat generating components may be distributed to both sides of a printed circuit board (PCB) to dissipate heat in different directions to help lower skin temperature.

Thermal solutions such as, for example, vapor chambers, heat pipes, heat sinks, thermal spreaders, etc. may be used on both sides of a PCB to dissipate heat from the heat generating components. However, in prior designs, the different thermal solutions on different sides of the PCB operated independently and do not and cannot share their respective cooling capacity. Example thermal solutions disclosed herein deliver a true double-sided thermal solution that is thermally looped and can dissipate heat efficiently on both sides of a PCB.

Examples disclosed herein include one or more cooling plates on a side of a PCB that are coupled to a thermal solution on the other side of the PCB. For example, a first cooling plate on a first side of a PCB may be coupled or looped (thermally and/or fluidically) with a second cooling plate on a second side of the PCB. In some examples, the two cooling plates (also referred to as double deck or trans-board cooling plates) additionally or alternatively include heat pipes or other devices and structures used in thermal solutions. In some examples, the cooling plates include a coolant (e.g., a liquid) that is continuously looped through the cooling plates. In some examples, the thermal solution includes connector(s), control valve(s), and/or pump(s) to control the flow of the coolant to efficiently cool the components on both sides of the PCB. In some examples, the thermal solution is pumpless.

With the cooling plates in fluid communication, the coolant running through the cooling plates can cool heat generating components on either side of the PCB. Therefore, the cooling plate on a first side of the PCB effectively cools heat generating components on the second side of the PCB as well as the heat generating components on the first side of the PCB. Likewise, the cooling plate on the second side of the PCB effectively cools heat generating components on the first side of the PCB as well as the heat generating components on the second side of the PCB. The additional layer(s) in the thermal solution also provide additional space for a larger volume of coolant. In addition, the example thermal solutions disclosed herein significantly improve cooling capability without adding any system Z-height to the electronic device. The examples disclosed herein allow the CPU/GPU package to operate at a high power without throttling and without producing hot spots on the chassis.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 1 is a schematic perspective view of a portion of an example electronic device 100 including an example thermal solution that includes an example first cooling plate 102 on a first side of an example PCB 104 and an example second cooling plate 106 on a second side of the PCB 104. In FIG. 1, the second cooling plate 106 is shown in phantom lines because in this view, the second cooling plate 106 is below the PCB 104. In examples disclosed herein, the first cooling plate 102 and/or the second cooling plate 106 may include copper, aluminum, other metals, composite materials, and/or other materials or combinations of materials.

The example electronic device 100 includes a coolant that flows in the first cooling plate 102 and the second cooling plate 106. In some examples the coolant is a liquid such as, for example, a non-conductive liquid. In some examples, the coolant is water. In some examples, the coolant is an engineered fluid such as, for example, 3M™ Novec™ fluid. In other examples, other fluids or combinations of fluids may be used for the coolant. The coolant has a flow pattern through the first cooling plate 102 shown by the arrow A in FIG. 1. The coolant also flows through the second cooling plate 106 with a flow pattern shown by the arrow B in FIG. 1. The flow pattern through the first cooling plate 102 is looped with the flow pattern through the second cooling plate 106. The second cooling plate 106 increases the potential liquid volume for the coolant. The additional amount of coolant helps reduce, arrest, or prevent temperature rise in the electronic device 100. The lower temperature rise enables increased performance of the heat generating components of the electronic device 100. In some examples, the second cooling plate 106 increases the liquid volume by 60%. In some examples, the second cooling plate doubles the amount of liquid volume. The greater volume leads to increased thermal capacitance, which translates into enhanced performance of the electronic device 100 including, for example, extended turbo power (e.g., PL2) duration and higher benchmark scores, such as for example Cinebench R20/R23, when evaluating hardware capabilities.

The electronic device 100 also includes an example first fan 108 and an example second fan 110. In other examples, there may be more or fewer fans (e.g., 1, 3, 4, etc.). In some examples, the fans 108, 110 are also part of the thermal solution. The circulation of the coolant inside the closed loop of the first cooling plate 102 and the second cooling plate 106 helps to absorb the heat from the components and move the heat to a fin stack. The heat at the fin stack is released to airflow driven by the fans 108, 110.

Figure 2:
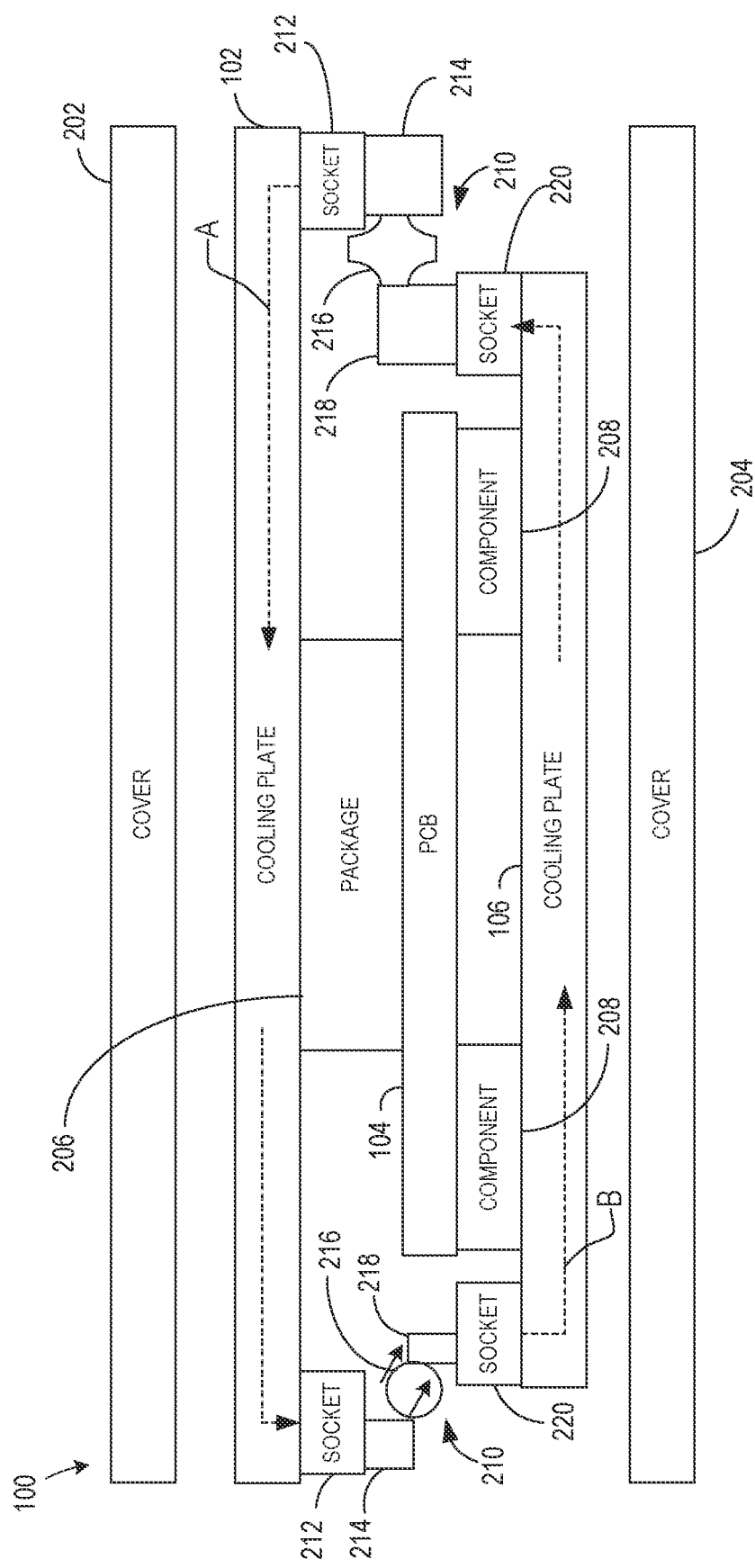
FIG. 2 is a schematic cross-sectional view of an example electronic device including the thermal solution of FIG. 1.

FIG. 2 is a schematic cross-sectional view of the example electronic device 100. The electronic device 100 includes a chassis that includes a first cover 202 and a second cover 204. In some examples, the first cover 202 is a C cover, and the second cover 204 is a D cover. The first cooling plate 102, the PCB 104, and the second cooling plate 106 are positioned between the first cover 202 and the second cover 204.

Heat generating components such as an example CPU/GPU package 206 is coupled on one side of the PCB 104 between the PCB 104 and the first cooling plate 102. Additional components 208 are coupled on an opposite side of the PCB 104 between the PCB 104 and the second cooling plate 106. The additional components 208 can be heat generating components and/or types of components including, for example, voltage regulation components, memory, process acceleration cards, etc. The coolant flowing through the first cooling plate 102 (shown by arrow A) and through the second cooling plate 106 (shown by arrow B) capture and dissipate heat from the components 206, 208.

In the illustrated example, the first cooling plate 102 and the second cooling plate 106 are coupled by an example fluid conduit 210. In the illustrated example, there are two fluid conduits 210. In other examples, there may be additional fluid conduits coupling the first cooling plate 102 and the second cooling plate 106. The fluid conduits 210 are pathways that allow the coolant to flow between the first cooling plate 102 and the second cooling plate 106. Thus, the fluid conduits 210 create a complete liquid circulation loop. The fluid conduits 210 are sealed to prevent leakage of the coolant in the electronic device 100.

The fluid conduits 210 include an example first socket 212, an example first tube 214, an example valve 216, an example second tube 218, and an example second socket 220. The first tube 214 is coupled to the first cooling plate 102 via the first socket 212. The second tube 218 is coupled to the second cooling plate 106 via the second socket 220. The valve 214 couples the first tube 214 and the second tube 218. In some examples, the first tube 214 and the second tube 218 are flexible tubes. In the example illustrated in FIG. 2, the first tube 214 and the second tube 218 run around the PCB 104. In some examples, one of or both of the first tube 214 and the second tube 218 run through the PCB 104. The specific tube layout depends on the system layout of the electronic device 100 and the space available. In some examples, the first tube 214 and/or the second tube 218 include one or more of rubber, plastic, metal, and/other a combination of materials.

Figure 3:
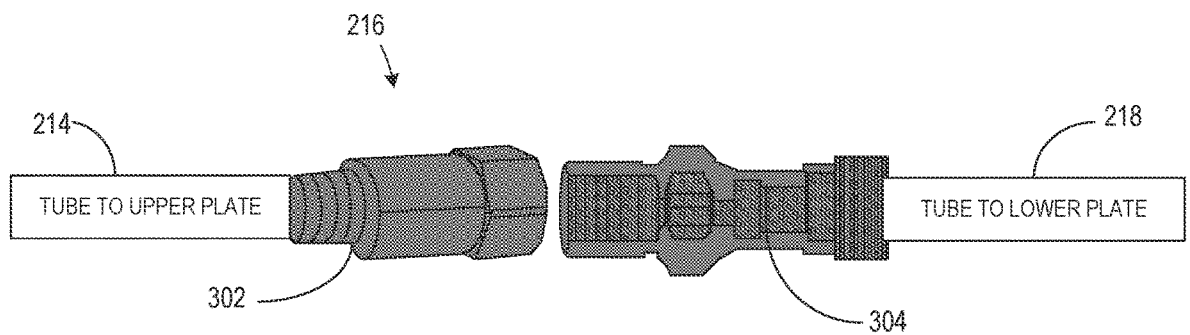
FIG. 3 is a detail view of an example valve used in the thermal solution of FIG. 1.

FIG. 3 is a detail view of the example valve 216 used in the thermal solution of FIG. 1 to couple the first tube 214 and the second tube 218. The valve 216 includes a female end 302 (e.g., valve core) coupled to a male end 304 (e.g., valve stem). In some examples, the valve 216 is a Schrader valve. In other examples, other valves may be used. The Schrader valve assists with maintaining the coolant sealed. In some examples, the Schrader valve is serviceable by users. Also, in some examples, the first tube 214 and the second tube 218 are coupled with the valve 216 after the first cooling plate 102 and the second cooling plate 106 are coupled to or about the PCB 104.

Figure 4:
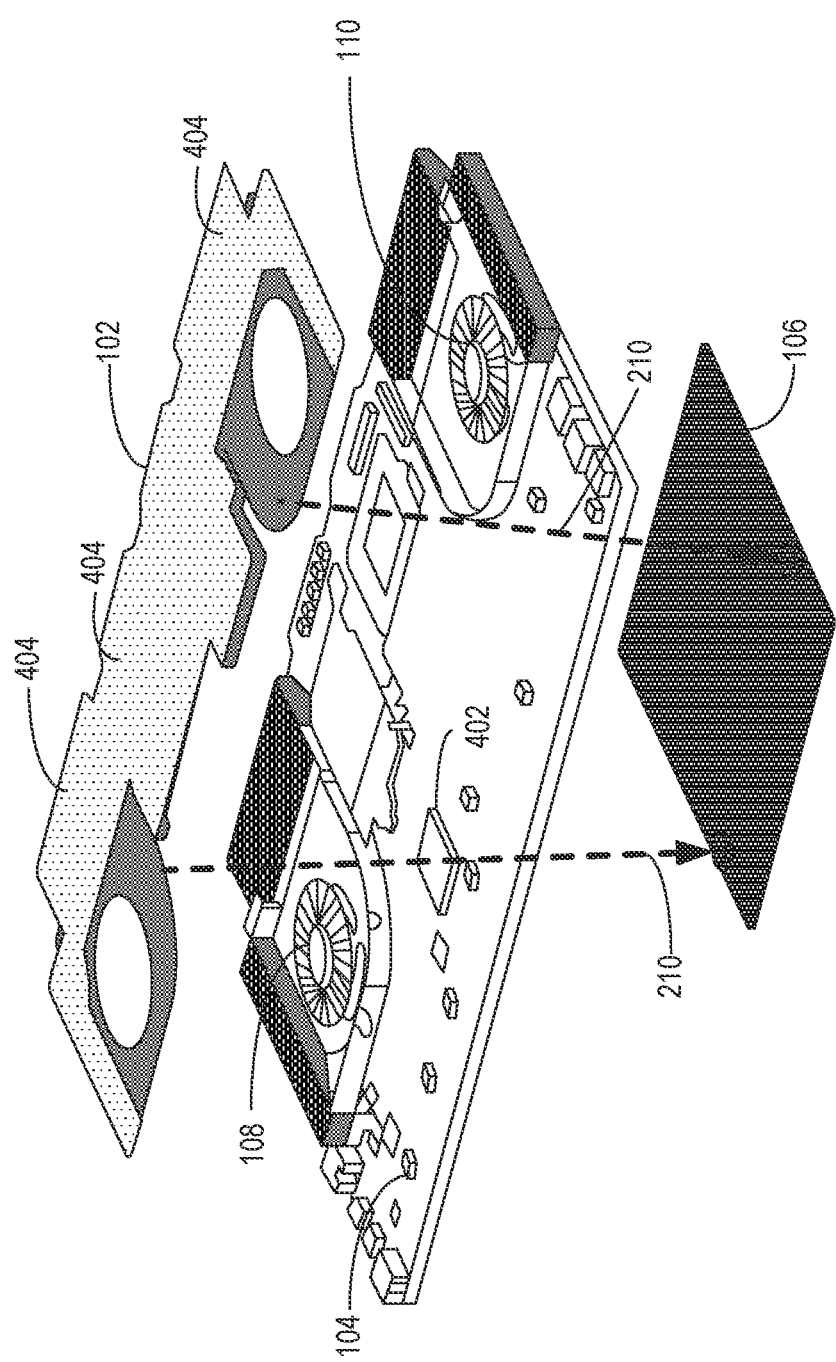
FIG. 4 is an exploded view of the portion of the electronic device of FIG. 1.

FIG. 4 is an exploded view of the portion of the electronic device 100 of FIG. 1. FIG. 4 illustrates the fluid conduits 210 creating a flow path between the first cooling plate 102 and the second cooling plate 106. In some examples, there is a motor or a pump 402 to generate flow of the coolant in the first cooling plate 102 and the second cooling plate 106. In the illustrated example, the pump 402 is positioned between the first cooling plate 102 and the second cooling plate 106. In some examples, placement of the pump 402 between the first cooling plate 102 and the second cooling plate 106 makes the over thermal solution more compact and thus saves space, includes fewer connections, and lowers the risk of leakage. In other examples, the pump 402 may be placed outside of the first cooling plate 102 and the second cooling plate 106. Placement of the pump 402 outside the first cooling plate 102 and the second cooling plate 106 may provide flexibility in pump selection, larger pumping capacity for cooling, but could include connections, higher risk of leakage, and potential increase system stack up and thickness (in the Z-height). In some examples, the pump 402 is a compact pump or a mini pump.

The coolant flowing through both of the cooling plates 102, 106 (as depicted by arrows A and B in FIG. 1). The arrows A, B show a general flow direction in the illustrated example. The coolant is flowing throughout the entirety of the cooling plates 102, 106 and not merely in the area directly under the arrows A, B in FIG. 1. The cooling plates 102, 106 are wickless and, therefore, are distinct from thermal solutions of vapor chambers that rely on capillary action and phase changes of materials within the vapor chambers. Also, in some examples, the cooling plates 102, 106 are thinner than vapor chambers. For example, each of the cooling plates 102, 106 may be ultra-thin such as, for example, less than 1 millimeter (mm). Also, in some examples the cooling plates 102, 106 can support a high maximum power (Qmax) such as, for example 300 Watts without experiencing dryout.

In addition, the cooling plates 102, 106 include a plurality of valves 404 included within the cooling plates 102, 106. The valves 404 guide the flow of the coolant through the cooling plates 102, 106. In some examples, the valves 404 are passive check valves that allow the coolant to flow in one direction while impeding flow in the reverse direction. The passive valves operate with no moving parts. In addition, in some examples, the flow of coolant inside the plates 102, 106 is guided by an array of triangle spacers inside a liquid chamber housing the coolant. A plurality of valves 404 in shown in FIG. 4, in other examples, there may be more or fewer valves 404. In some examples, the valves 404 cover all or substantially all of the first cooling plate 102 and/or the second cooling plate 106.

FIG. 5 is a known PCB layout. A PCB 500 has no thermal solution on the second side of the PCB 500 (the opposite side than shown in FIG. 5). Therefore, the power delivery and voltage regulating (PDVR) components 502 have to be placed on the first side of the PCB 500. This limits routing channels 504 for the high speed input output (HSIO) lanes traveling south, west, and east. For example, the HSIO lanes may be limited to about 9 mm per side.

FIG. 6 is an example PCB layout of a first side of an example PCB 600 including an example thermal solution disclosed herein. FIG. 7 is an example PCB layout of a second side of the PCB 600 of FIG. 6. With cooling plates (e.g., 102, 106) placed on both sides of the PCB 600, the PDVR components 604 can be distributed to both sides of the PCB 600. The distribution of the PDVR components 604 on both sides of the PCB 600 allows for wider routing channels 606 for the HSIO lanes. For example, the routing channels 606 may be about 14 mm per side.

Figure 8:
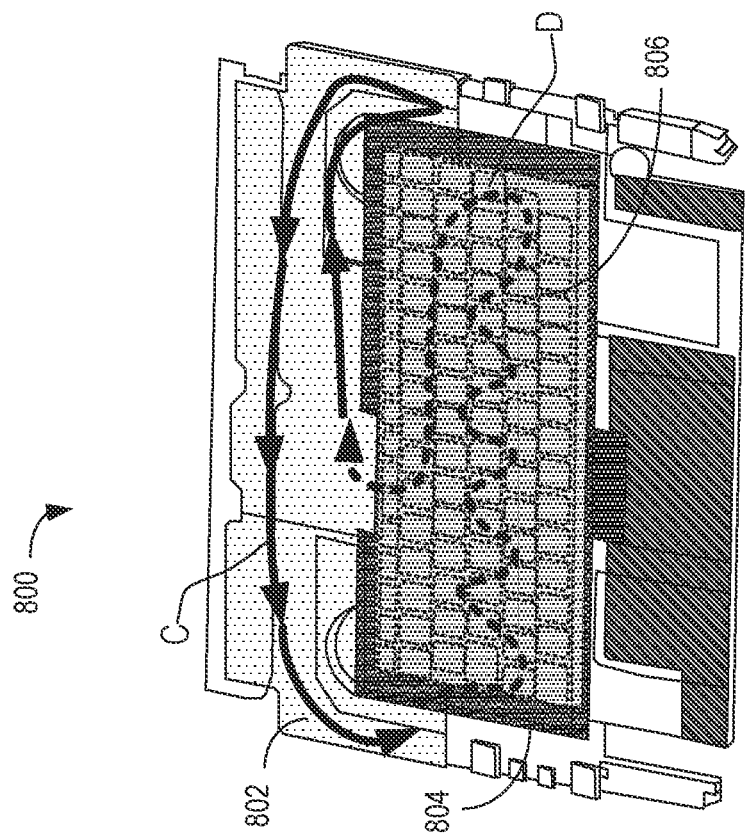
FIG. 8 is a schematic perspective view of a portion of an example electronic device including an example first coolant flow pattern.

FIG. 8 is a schematic perspective view of a portion of an example electronic device 800 including an example coolant flow pattern (arrow C) through an example first cooling plate 802. The electronic device 800 also includes an example coolant flow pattern (arrow D) through an example second cooling plate 804. The positions and shape of the arrows C, D are illustrative for general flow directions. In some examples, the coolant is flowing throughout some chambers or an entirety of the first cooling plate 802 and/or the second cooling plate 804. The first cooling plate 802 and the second cooling plate 804 may be coupled in accordance with the examples disclosed above. In the example of FIG. 8, the second cooling plate 804 includes a keyboard bracket under a keyboard 806. In some examples, use of the keyboard bracket as the second cooling plate 804 in addition to the first cooling plate 802 increases the coolant volume by 60%, which increases cooling capability.

Figure 9:
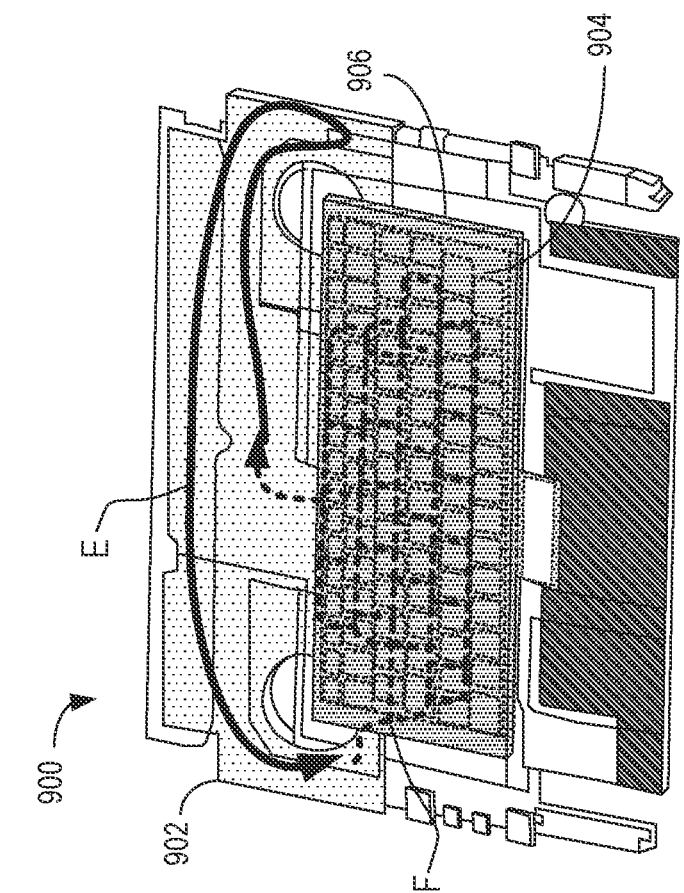
FIG. 9 is a schematic perspective view of a portion of an example electronic device including an example second coolant flow pattern.

FIG. 9 is a schematic perspective view of a portion of an example electronic device 900 including an example second coolant flow pattern (arrow E) through an example first cooling plate 902. The electronic device 900 also includes an example coolant flow pattern (arrow F) through an example second cooling plate 904. The positions and shape of the arrows E, F are illustrative for general flow directions. In some examples, the coolant is flowing throughout some chambers or an entirety of the first cooling plate 902 and/or the second cooling plate 904. The first cooling plate 902 and the second cooling plate 904 may be coupled in accordance with the examples disclosed above. In the example of FIG. 9, the second cooling plate 804 includes a keyboard support plate under a keyboard 906. In some examples, use of the keyboard support plate as the second cooling plate 904 in addition to the first cooling plate 902 increases the coolant volume by 30%, which increases cooling capability.

In some examples, the chassis (e.g., C cover and/or the D cover) of an electronic device (e.g., the electronic devices 100, 800, 900) can be also used as a part of the one of the cooling plates (e.g., cooling plates 102, 106, 802, 902). In such examples where a cooling plate is integrated to a chassis cover, a thermal insulating layer may also be included on one or more outer surfaces of the chassis to prevent the skin temperature from exceeding an ergonomic limit (e.g., greater than 48° C.).

Figure 10:
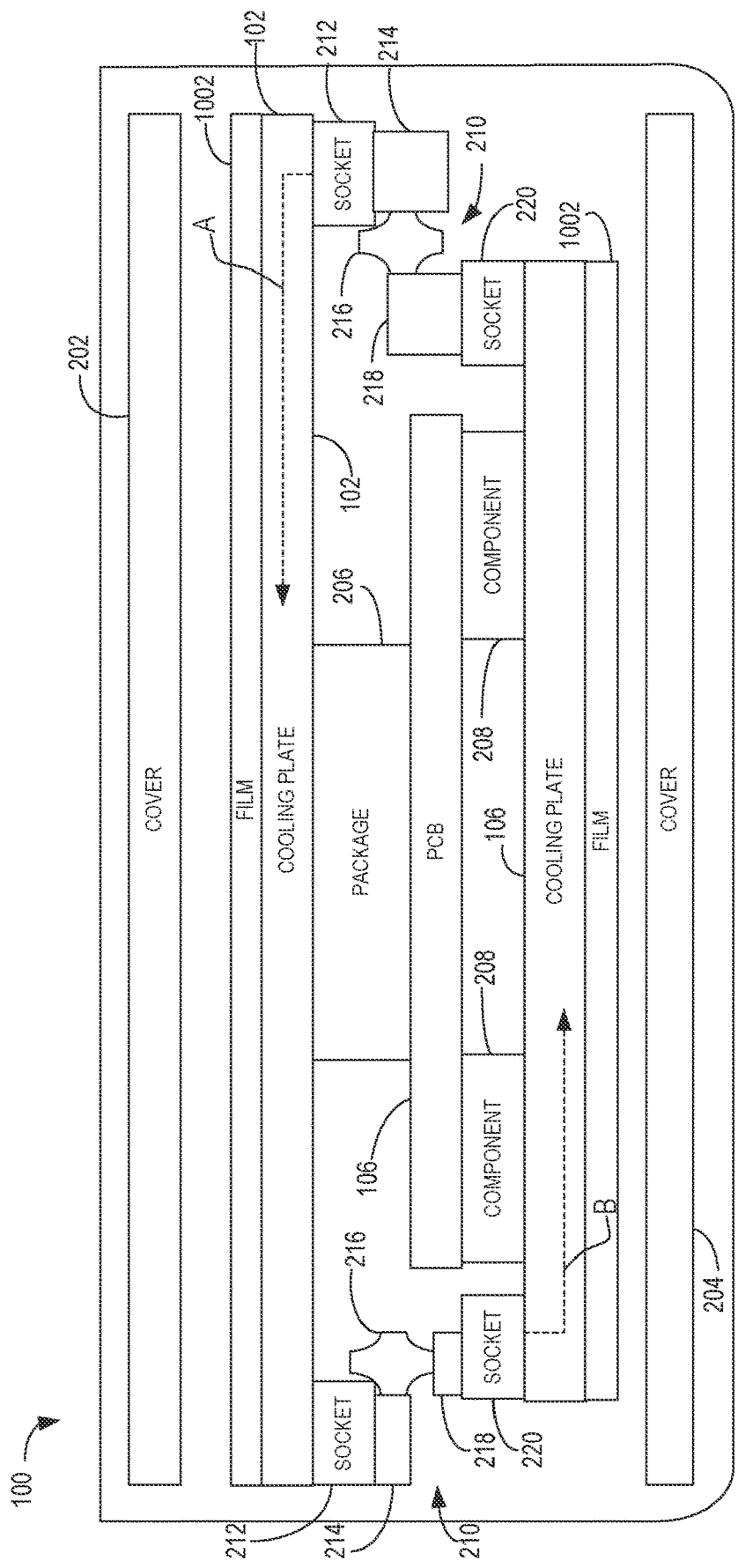
FIG. 10 is a schematic cross-sectional view of the example electronic device of FIG. 1 including an example film for an example thermal solution disclosed herein.

FIG. 10 is a schematic cross-sectional view of the electronic device 100 including additional elements in the thermal solution. In the example of FIG. 10, the thermal solution does not include a pump. Instead, an electromagnetic field is used to create flow of the coolant. In this example, the coolant is ionized water or other conductive material. The electromagnetic field generates a force that controls the flow of the coolant in the first cooling plate 102 and the second cooling plate 106. The additional element used in this example, which facilitates the creation of the electromagnetic field is an example film 1002. In some examples, there is a film 1002 on both the first cooling plate 102 and the second cooling plate 106. In some examples, there is a film 1002 on one of the first cooling plate 102 or the second cooling plate 106. In some examples, the film 1002 is positioned on the first cooling plate 102 and/or the second cooling plate 106 between the first cooling plate 102 and/or the second cooling plate 106 and the respective first cover 202 and/or second cover 1002 as shown in FIG. 10. In some examples, the film 1002 includes polyethylene terephthalate (PET), polyamide (PI), a flexible PCB cover film (CVL) and/or other suitable material or combination of materials.

Figure 11B:
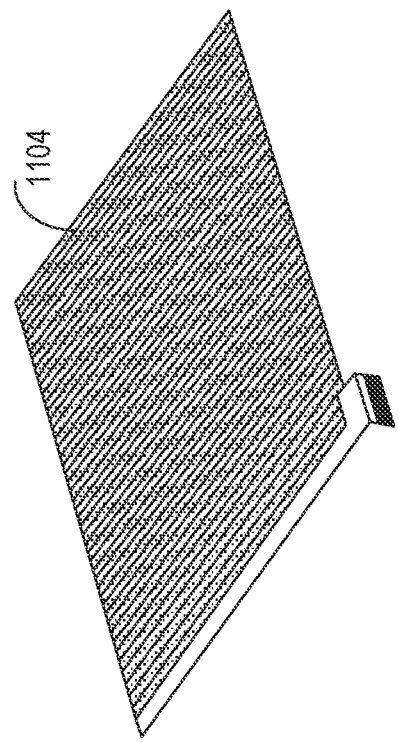
FIG. 11B is a schematic view of a second side of the film of FIG. 10.
Figure 11A:
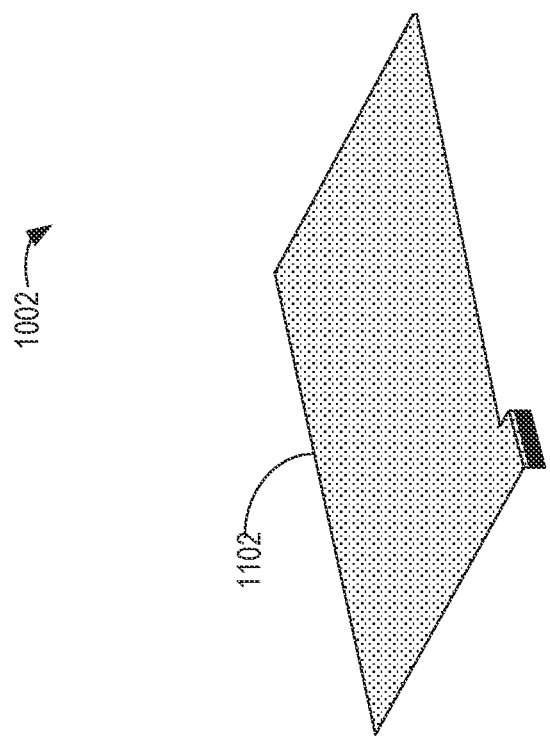
FIG. 11A is a schematic view of a first side of the film of FIG. 10.

FIG. 11A is a schematic view of a first side of the film 1002. The first side has a coating and/or pattern of adhesive 1102. The adhesive 1102 couples the film 1002 to the respective first cooling plate 102 or second cooling plate 106. FIG. 11B is a schematic view of a second side of the film 1002. The film 1002 includes one or more electrodes 1104. In some examples the electrodes 1104 are a pattern or array of electrodes or an electrode strip. The electrodes 1104 are tied to adjustable low/high voltages or bias. The voltage can be adjusted depending on the cooling needs of the electronic device. When the voltage is applied, the electrodes 1104 charge the cooling plates 102, 106, which generates the electromagnetic field. The coolant is ionized water which includes two hydrogen atoms and one oxygen atom, and is made up of charged particles, with the two hydrogen atoms having a positive charge. Because of the liquid form of water, these atoms are free to move around any which way and can easily be affected by a static electrical charge. The applied voltage and electromagnetic field creates a bias that attracts/repels water flow. The flow of the coolant (e.g., the ionized water) creates an intentional directional path for efficient and faster heat dissipation from heat generating components 206, 208 to cooler region of the electronic device 100 (e.g., to a fin assembly for further heat dissipation by airflow generated by the fans 108, 110). In some examples, the cooling rate can be controlled by water flow velocity, which is adjustable linearly based on the level of voltage bias applied to electrodes 1104.

The use of the film 1002 does increase the thickness of the first cooling plate 102 and the second cooling plate 106. For example, the first cooling plate 102 and/or the second cooling plate 106 may be slightly thicker (e.g., 0.2 mm-0.3 mm). However, the pump has been removed and the original space for the pump is free for other usages. Thus, the overall thermal solution is usable in smaller electronic devices such as, for example, high performance laptop systems including, for example, 16-inch gaming or creator laptops.

From the foregoing, it will be appreciated that example systems, methods, apparatus, and articles of manufacture have been disclosed that provide thermal solutions to cool electronic devices. Disclosed systems, methods, apparatus, and articles of manufacture improve the efficiency of using an electronic device by effectively cooling the electronic device, which enables the electronic device to operate at higher power and operating levels without, for example, throttling. Disclosed systems, methods, apparatus, and articles of manufacture are accordingly directed to one or more improvement(s) in the operation of a machine such as a computer or other electronic and/or mechanical device.

Example methods, apparatus, systems, and articles of manufacture are disclosed to cool electronic devices. Example 1 includes a first cooling plate at a first side of a printed circuit board and a second cooling plate at a second side of the printed circuit board, the second side opposite the first side. The second cooling plate is fluidically coupled with the first cooling plate.

Example 2 includes the electronic device of Example 1, further including a coolant to flow between the first cooling plate and the second cooling plate.

Example 3 includes the electronic device of Example 2, further including a pump to create a flow of the coolant between the first cooling plate and the second cooling plate.

Example 4 includes the electronic device of Examples 2 or 3, further including a passive valve to control the flow of the coolant.

Example 5 includes the electronic device of any of Examples 2-4, wherein the coolant includes a non-conductive liquid.

Example 6 includes the electronic device of any of Examples 2-6, further including a polyester film having an electrode to conduct an electromagnetic field to create flow of the coolant.

Example 7 includes the electronic device of any of Example 6, wherein the coolant is ionized water.

Example 8 includes the electronic device of Examples 6 or 7, wherein the polyester film includes a first layer on the first cooling plate and a second layer on the second cooling plate.

Example 9 includes the electronic device of Example 8, wherein the electrode is included in a first electrode array on the first layer of the polyester film, the electronic device further including a second electrode array on the second layer of the polyester film Example 10 includes the electronic device of any of Examples 1-9, wherein the first cooling plate and the second cooling plate are wickless.

Example 11 includes the electronic device of any of Examples 1-10, wherein the first cooling plate and the second cooling plate are coupled by a plurality of tubes.

Example 12 includes the electronic device of Example 11, wherein a first tube of the plurality of tubes is coupled to the first cooling plate and a second tube of the plurality of tubes is coupled to the second cooling plate, the electronic device further including a valve coupled between the first tube and the second tube.

Example 13 includes the electronic device of Example 12, wherein the valve is a Schrader valve.

Example 14 includes the electronic device of any of Examples 11-13, wherein the plurality of tubes includes flexible tubes.

Example 15 includes the electronic device of any of Examples 1-13, wherein the first cooling plate includes a keyboard bracket.

Example 16 includes the electronic device of any of Examples 1-15, wherein the first cooling plate includes a keyboard support plate.

Example 17 includes an electronic device that includes a heat generating component; a first cooling plate at a first side of the heat generating component; a second cooling plate at a second side of the heat generating component; and means for fluidly coupling the first cooling plate and the second cooling plate.

Example 18 includes the electronic device of Example 17, further including: a coolant to flow between the first cooling plate and the second cooling plate; and means for creating a flow of the coolant between the first cooling plate and the second cooling plate.

Example 19 includes the electronic device of Examples 17 or 18, wherein the means for fluidly coupling includes a plurality of flexibles tubes.

Example 20 includes the electronic device of any of Examples 17-19, further including a printed circuit board, the heat generating component coupled to the printed circuit board, the means for fluidly coupling traverses through the printed circuit board.

Example 21 includes the electronic device of any of Examples 17-20, wherein the heat generating component is a first heat generating component, the electronic device further including: a printed circuit board, the first heat generating component coupled to a first side of the printed circuit board; and a second heat generating component coupled to a second side of the printed circuit board, the first heating generating component, printed circuit board, and second heat generating component between the first cooling plate and the second cooling plate.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An electronic device comprising:
   a printed circuit board;
   a first cooling plate at a first side of the printed circuit board;
   a second cooling plate at a second side of the printed circuit board, the second side opposite the first side, and the second cooling plate fluidically coupled with the first cooling plate;
   a coolant to flow between the first cooling plate and the second cooling plate; and
   a polyester film having an electrode to conduct an electromagnetic field to create flow of the coolant, wherein the polyester film includes a first layer on the first cooling plate and a second layer on the second cooling plate.

2. The electronic device of claim 1, further including a pump to create a flow of the coolant between the first cooling plate and the second cooling plate.

3. The electronic device of claim 1, wherein the coolant includes a non-conductive liquid.

4. The electronic device of claim 1, wherein the coolant is ionized water.

5. The electronic device of claim 1, wherein the electrode is included in a first electrode array on the first layer of the polyester film, the electronic device further including a second electrode array on the second layer of the polyester film.

6. The electronic device of claim 1, wherein the first cooling plate and the second cooling plate are wickless.

7. The electronic device of claim 1, wherein the first cooling plate and the second cooling plate are coupled by a plurality of tubes.

8. The electronic device of claim 7, wherein a first tube of the plurality of tubes is coupled to the first cooling plate and a second tube of the plurality of tubes is coupled to the second cooling plate, the electronic device further including a valve coupled between the first tube and the second tube.

9. The electronic device of claim 8, wherein the valve is a Schrader valve.

10. The electronic device of claim 7, wherein the plurality of tubes includes flexible tubes.

11. The electronic device of claim 1, wherein the first cooling plate includes a keyboard bracket.

12. The electronic device of claim 1, wherein the first cooling plate includes a keyboard support plate.

13. An electronic device comprising:
    a heat generating component;
    a first cooling plate at a first side of the heat generating component;
    a second cooling plate at a second side of the heat generating component;
    means for fluidly coupling the first cooling plate and the second cooling plate;
    a coolant to flow in the means for fluidly coupling; and
    a polyester film having means for creating a flow of the coolant between the first cooling plate and the second cooling plate, the polyester film includes a first layer on the first cooling plate and a second layer on the second cooling plate.

14. The electronic device of claim 13, wherein the means for fluidly coupling includes a plurality of flexibles tubes.

15. The electronic device of claim 13, further including a printed circuit board, the heat generating component coupled to the printed circuit board, the means for fluidly coupling traverses through the printed circuit board.

16. The electronic device of claim 13, wherein the heat generating component is a first heat generating component, the electronic device further including:
    a printed circuit board, the first heat generating component coupled to a first side of the printed circuit board; and
    a second heat generating component coupled to a second side of the printed circuit board,
    the first heating generating component, the printed circuit board, and the second heat generating component between the first cooling plate and the second cooling plate.

* * * * *